(12) United States Patent
Takahashi et al.

(10) Patent No.: US 11,322,555 B2
(45) Date of Patent: May 3, 2022

(54) LIGHT-EMITTING DEVICE, DISPLAY APPARATUS, AND IMAGE PICKUP APPARATUS

(71) Applicant: CANON KABUSHIKI KAISHA, Tokyo (JP)

(72) Inventors: Tetsuo Takahashi, Kawasaki (JP); Koji Ishizuya, Fujisawa (JP); Norifumi Kajimoto, Zama (JP); Hiroaki Sano, Chofu (JP); Akira Okita, Yamato (JP); Etsuro Kishi, Sagamihara (JP); Masaki Kurihara, Koza-gun (JP); Daisuke Shimoyama, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/118,278

(22) Filed: Dec. 10, 2020

(65) Prior Publication Data

US 2021/0098536 A1 Apr. 1, 2021

Related U.S. Application Data

(63) Continuation of application No. 16/370,541, filed on Mar. 29, 2019, now Pat. No. 10,896,934.

(30) Foreign Application Priority Data

Apr. 3, 2018 (JP) .............................. JP2018-071660

(51) Int. Cl.
*H01L 27/32* (2006.01)
*H01L 51/52* (2006.01)
*H01L 51/50* (2006.01)

(52) U.S. Cl.
CPC .......... *H01L 27/322* (2013.01); *H01L 27/326* (2013.01); *H01L 27/3211* (2013.01); (Continued)

(58) Field of Classification Search
CPC ............... H01L 27/3211; H01L 27/322; H01L 27/3244; H01L 27/3246; H01L 27/326
See application file for complete search history.

(56) References Cited

U.S. PATENT DOCUMENTS

2014/0339521 A1* 11/2014 Ozawa ................ H01L 51/5253
257/40
2015/0270319 A1* 9/2015 Ishii .................... H01L 27/3246
257/40
(Continued)

FOREIGN PATENT DOCUMENTS

EP 1791182 A2 5/2007
JP 2005093398 A 4/2005
(Continued)

*Primary Examiner* — Matthew E Warren
(74) *Attorney, Agent, or Firm* — Canon U.S.A., Inc. IP Division

(57) ABSTRACT

The present invention provides a light-emitting device including a substrate, a first EL element, and a second EL element, the first EL element and the second EL element each including a lower electrode, an organic compound layer including a light-emitting layer, an upper electrode, and a color filter in this order from the substrate, and an insulating layer that covers an end portion of the lower electrode. A first color filter of the first EL element and a second color filter of the second EL element overlap each other when viewed in plan in an overlapping region, and an inclined portion closest to the first EL element among inclined portions of the insulating layer of the second EL element and the overlapping region overlap each other when viewed in plan.

20 Claims, 8 Drawing Sheets

(52) U.S. Cl.
CPC ...... *H01L 27/3244* (2013.01); *H01L 27/3246* (2013.01); *H01L 51/5012* (2013.01); *H01L 51/5253* (2013.01)

(56) References Cited

U.S. PATENT DOCUMENTS

| | | |
|---|---|---|
| 2015/0318447 A1 | 11/2015 | Choi |
| 2017/0110522 A1 | 4/2017 | Lee |
| 2017/0317152 A1 | 11/2017 | Hsu |
| 2018/0182814 A1* | 6/2018 | Kim ...................... H01L 27/322 |
| 2019/0165068 A1* | 5/2019 | Park ................... H01L 51/5284 |

FOREIGN PATENT DOCUMENTS

| | | |
|---|---|---|
| JP | 2012018868 A | 1/2012 |
| JP | 2013-20744 A | 1/2013 |
| JP | 2015050096 A | 3/2015 |
| JP | 2015-128003 A | 7/2015 |
| JP | 2015185227 A | 10/2015 |

\* cited by examiner

LIGHT-EMITTING DEVICE, DISPLAY APPARATUS, AND IMAGE PICKUP APPARATUS

CROSS-REFERENCE TO RELATED APPLICATIONS

This application is a Continuation of U.S. application Ser. No. 16/370,541 filed Mar. 29, 2019, which claims the benefit of priority from Japanese Patent Application No. 2018-071660, filed Apr. 3, 2018, each of which is hereby incorporated by reference herein in its entirety.

BACKGROUND OF THE INVENTION

Field of the Invention

The present invention relates to a light-emitting device, a display apparatus, and an image pickup apparatus.

Description of the Related Art

Organic electroluminescence (EL) techniques provide an element including a pair of electrodes and an organic compound layer disposed between the pair of electrodes. Organic EL elements have been put to practical use as light-emitting devices for slim displays, lighting apparatuses, head mount displays, and light sources for print heads of electrophotographic printers with their excellent features such as surface emission characteristics, light weight, and visibility.

In particular, higher resolution from organic EL display apparatuses has been increasingly demanded. A mode that uses a white organic EL element and a color filter (hereafter referred to as a "white+CF mode") is known. The white+CF mode is a mode in which color pixels such as red pixels, green pixels, and blue pixels are formed by disposing color filters, that absorb light with different wavelengths, in a direction in which white light is emitted from an organic EL element, which enables a color display. When the white+CF mode is employed, higher resolution is relatively easily achieved because production is performed by depositing an organic compound layer on the entire surface of a substrate and thus the pixel size and the pitch between pixels are not dependent on the precision of the vapor deposition of the organic compound layer. In the white+CF mode, an insulating layer is generally disposed between color pixels to electrically separate the color pixels. Light is emitted from an organic EL element of each color pixel in a region of each color filter, seen in a plan view, to improve the color purity of light emitted from the display apparatus. As the color purity of each color increases, a display apparatus having higher color reproducibility can be provided.

On the other hand, when light is emitted from a certain color pixel of an organic EL display apparatus that uses the white+CF mode, color mixing is caused by light emission through the color filters of non-light-emitting adjacent pixels or from adjacent pixels that emit light of another color, which are causes of the degrading the color gamut.

Japanese Patent Laid-Open No. 2013-20744 (hereinafter referred to as Patent Document 1) discloses an organic EL display apparatus in which color mixing is suppressed by overlapping end portions of adjacent color filters and disposing a light-shielding layer on the color filter.

Japanese Patent Laid-Open No. 2015-128003 (hereinafter referred to as Patent Document 2) discloses an organic EL display apparatus in which color mixing is suppressed by disposing a light-shielding film on a partition between adjacent color pixels.

In the light-emitting device, one of the causes of color mixing due to light scattering is an inclined portion of an insulating layer disposed between pixels, that is, reflection of light emitted from one pixel by an inclined end portion of the insulating layer through a color filter of an adjacent EL element.

Patent Document 1 describes that a region in which color filters overlap each other or a region in which a light-shielding layer is formed is disposed to suppress color mixing. However, the color mixing is not sufficiently suppressed because either of the regions do not overlap an inclined portion of an insulating layer when viewed in a plan view of the light-emitting device when viewed in a direction perpendicular to a main surface of the substrate.

Patent Document 2 describes that a light-shielding film is disposed to suppress color mixing. However, the light-shielding film causes color mixing because it reflects and scatters light guided through an organic compound layer.

Even if the light-shielding film is formed of a light-absorbing material, the light-shielding film needs to have a thickness of several hundred nanometers to sufficiently absorb light, and thus a large protrusion, constituted by a partition and the light-shielding film, is formed on a substrate. This increases the amount of stray light generated by light scattering at the partition and the light-shielding film, which causes color mixing. Furthermore, the large protrusion on the substrate tends to degrade a sealing layer.

SUMMARY OF THE INVENTION

The present invention provides a light-emitting device in which color mixing is suppressed by disposing a region in which color filters overlap each other and overlapping the region and an end portion of an insulating layer in a plan view and thus a wide color gamut is provided.

One aspect of the present invention provides a light-emitting device including a substrate; a first electroluminescence, EL, element and a second EL element disposed on the substrate, the first EL element and the second EL element each including a lower electrode, a light-emitting layer, an upper electrode, and a color filter in this order from the substrate; and an insulating layer disposed between the lower electrode and the light-emitting layer so as to cover an end portion of the lower electrode, wherein the first EL element has a first color filter and the second EL element has a second color filter which are arranged so as to partially overlap each other, in an overlapping region, when viewed in a plan view of the light emitting device when viewed in a direction perpendicular to a main surface of the substrate, and wherein the insulating layer of each of the first and second EL elements includes a plurality of inclined portions, and the inclined portion closest to the first EL element among the plurality of inclined portions of the second EL element and the overlapping region also overlap each other when viewed in said plan view.

Further features of the present invention will become apparent from the following description of exemplary embodiments with reference to the attached drawings. Each of the embodiments of the present invention described below can be implemented solely or as a combination of a plurality of the embodiments. Also, features from different embodiments can be combined where necessary or where the combination of elements or features from individual embodiments in a single embodiment is beneficial.

DESCRIPTION OF THE EMBODIMENTS

A light-emitting device according to an embodiment of the present invention includes a plurality of EL elements. In this light-emitting device, an inclined portion of an insulating layer disposed between the plurality of EL elements and a region in which color filters of the plurality of EL elements overlap each other when viewed in plan. Each of the EL elements includes a light-emitting layer. The light-emitting layer may be an inorganic light-emitting layer or an organic light-emitting layer.

The inclined portion of the insulating layer may be a portion including an inclined portion in which the insulating layer inclines towards a substrate. Light emitted from adjacent pixels is reflected at the inclined portion of the insulating layer, which causes color mixing. By providing a region in which a plurality of color filters overlap each other on a path through which the reflected light is emitted, unintended emission of light can be suppressed. The region in which the plurality of color filters overlap each other may be referred to as an overlapping region.

By suppressing the unintended emission of light, the color mixing can be suppressed. By suppressing the color mixing, a light-emitting device having a wide color gamut can be provided.

In this specification, the color filter may be referred to as, for example, a red color filter. The red color filter is a color filter that transmits red light. The same applies to other colors.

First Embodiment

Figure 1:
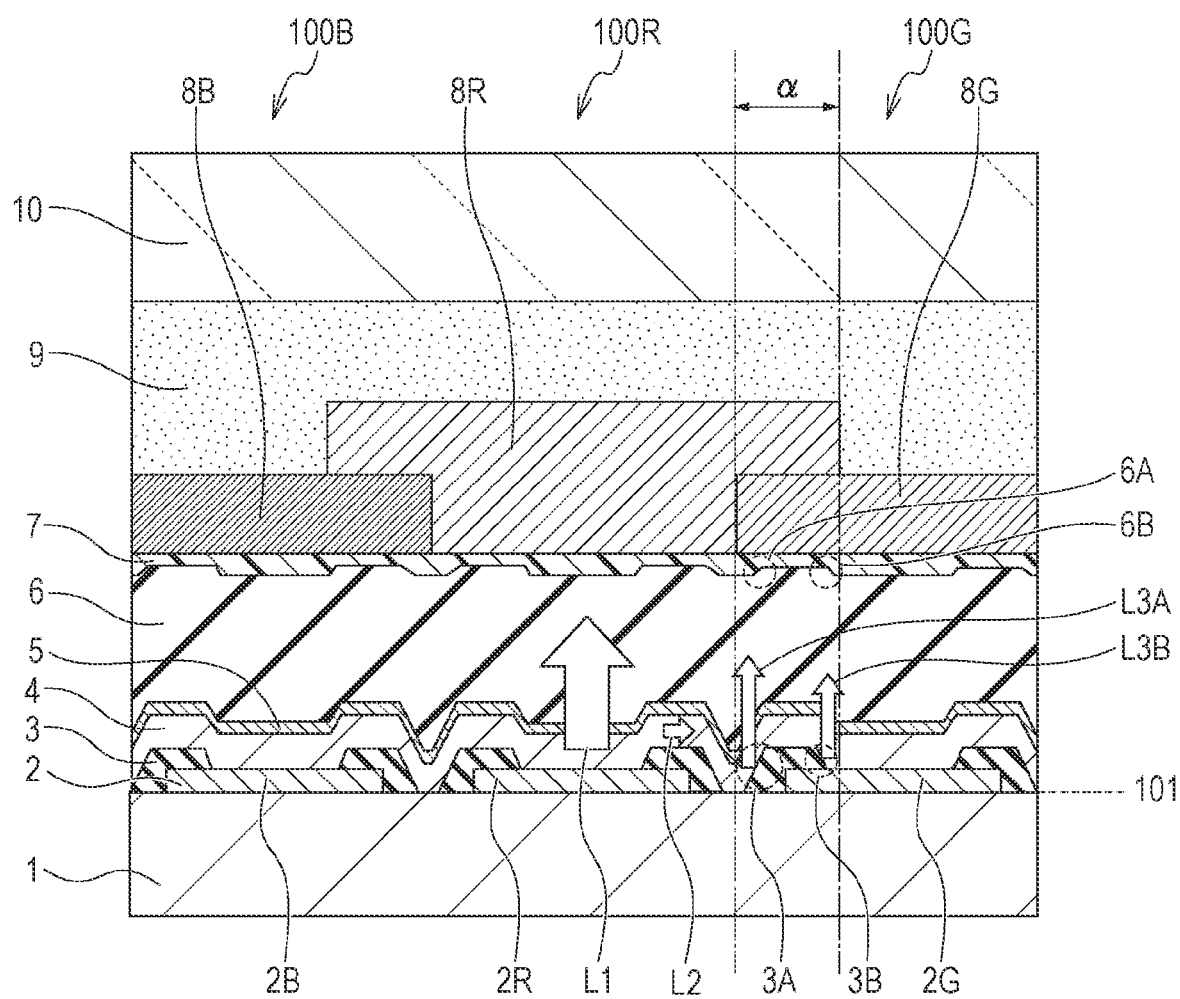
FIG. 1 is a schematic sectional view illustrating an example of a light-emitting device according to an embodiment of the present invention.

FIG. 1 is a schematic sectional view illustrating a light-emitting device according to a first embodiment of the present invention. The light-emitting device in FIG. 1 includes three types of organic EL elements 100R, 100G, and 100B that each include, on a substrate 1, a lower electrode 2, an organic compound layer 4, an upper electrode 5, a protective layer 6, a planarization layer 7, a color filter 8, a filling layer 9, and an opposing substrate 10 in this order from the substrate 1. Each of the organic EL elements is also referred to as a subpixel. The organic compound layer 4 and the upper electrode 5 are continuously formed in an in-plane direction of the substrate 1. Hereafter, the organic EL element 100R may be referred to as a first EL element, the organic EL element 100G may be referred to as a second EL element, and the organic EL element 100B may be referred to as a third EL element.

Herein, the direction that is perpendicular to the substrate 1 and extends toward the inside of the substrate is defined as a downward direction. The direction that is perpendicular to the substrate 1 and extends away from a surface 101 of the substrate 1 is defined as an upward direction. The distance from the surface 101 in the upward direction is also referred to as a height.

An insulating layer 3 is disposed in an area between three adjacent elements, namely, the first organic EL element 100R, the second organic EL element 100G, and the third organic EL element 100B. The insulating layer may be disposed between the lower electrode and the organic compound layer so as to cover an end portion of the lower electrode. The insulating layer has inclined portions 3A and 3B that incline towards the substrate.

The area between elements refers to an area between light-emitting regions of subpixels. In this embodiment, the area between elements is an area between pixel openings of the lower electrodes 2 of adjacent subpixels. An opening is a portion of the lower electrode that is not covered with the insulating layer. The insulating layer is provided to ensure the insulation between the lower electrodes 2B, 2G, and 2R and the upper electrode 5 and allows the light-emitting region to have a desired shape with high precision.

The color filter of each color is disposed on the corresponding organic EL element. A red color filter 8R is disposed on the organic EL element 100R, a green color filter 8G is disposed on the organic EL element 100G, and a blue color filter 8B is disposed on the organic EL element 100B.

The color filter 8G and the color filter 8R are disposed so as to overlap each other. The overlapping region (α) in which the color filter 8G and the color filter 8R overlap each other and the inclined portion 3A of the insulating layer overlap each other when viewed in plan. Furthermore, the inclined portions 3A and 3B and the overlapping region may overlap each other when viewed in plan as illustrated in FIG. 1. The phrase "when viewed in plan" refers to viewing in a direction perpendicular to the main surface of the substrate.

Figure 2:
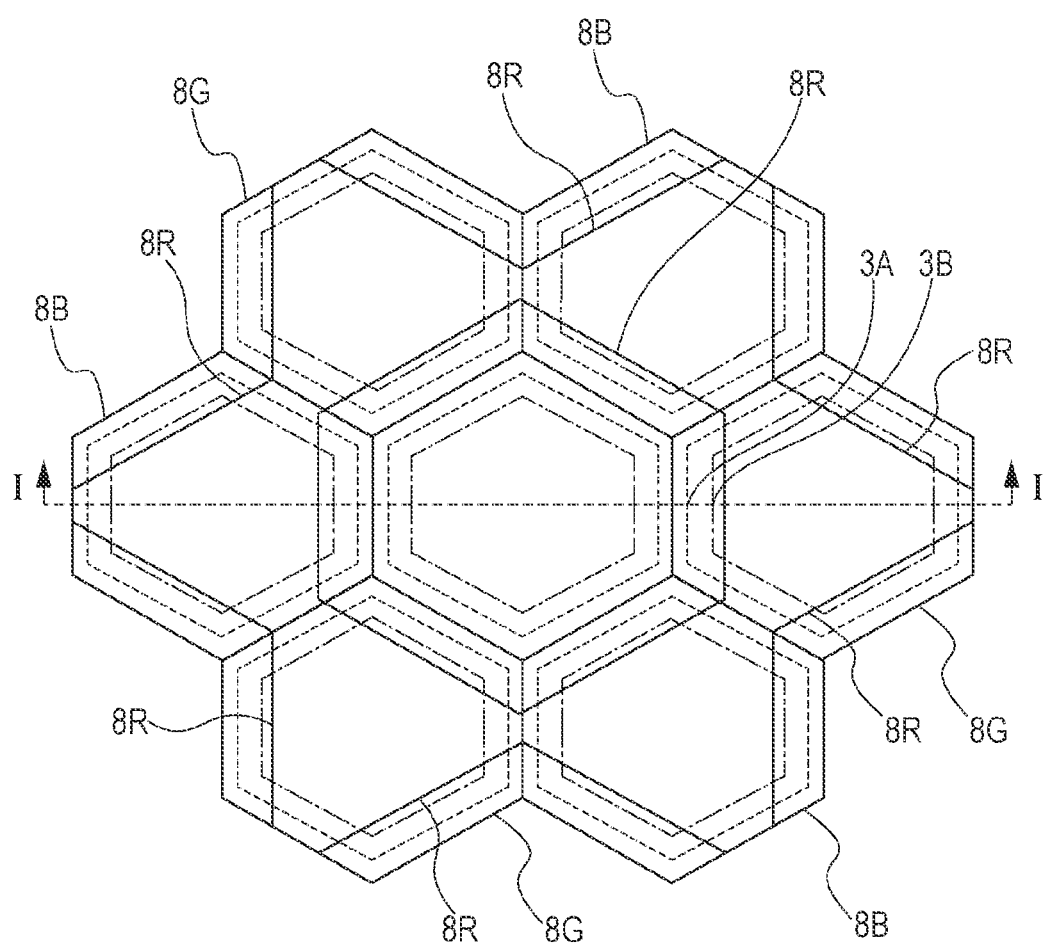
FIG. 2 illustrates an example of the light-emitting device according to an embodiment of the present invention in a plan view.

FIG. 2 schematically illustrates the light-emitting device according to this embodiment in a plan view. FIG. 1 is a sectional view taken along line I-I in FIG. 2. The overlapping region is disposed between a first color filter and a second color filter.

The advantages obtained from the above structure will be described.

When the organic EL element 100R emits light, white light L1 is emitted in the upward direction through the red color filter 8R, and red light is emitted to the outside of the display apparatus.

For the organic EL element, it is generally known that several tens of percent of light is guided through the organic compound layer. Guided light L2 in the organic compound layer propagates through the organic compound layer in a horizontal direction because of reflection of light between the surfaces of the lower electrode, the substrate, and the insulating layer and the upper electrode.

When the surfaces of the lower electrode and the insulating layer are parallel to the substrate, the guided light L2 readily propagates in the horizontal direction. However, the guided light L2 is easily scattered in the inclined portions of the insulating layer, such as the inclined portion 3A and the inclined portion 3B. Therefore, scattered light L3A at the inclined portion 3A and scattered light L3B at the inclined portion 3B are emitted in the upward direction. If the scattered light L3A and the scattered light L3B pass through only the green color filter 8G and are emitted to the outside of the light-emitting device as green light, color mixing is caused.

In contrast, when the inclined portion 3A and the inclined portion 3B are present in the region (a) in which the color filter 8R and the color filter 8G overlap each other when viewed in plan, the scattered light L3A and the scattered light L3B that have become green light as a result of passage of the green color filter 8G are shielded by the red color filter 8R. This suppresses the color mixing and improves the color purity.

As a result of thorough studies, the present inventors have further found the following findings. That is, the highest intensity of scattered light is observed in an inclined portion closest to the first EL element among inclined portions of the insulating layer of the second EL element.

Specifically, in FIG. 1, the inclined portion 3A is an inclined portion closest to the first EL element among inclined portions of the insulating layer of the second EL element. The scattered light L3A at the inclined portion 3A has the highest intensity.

That is, in the light-emitting device according to this embodiment, when an inclined portion closest to the first organic EL element among inclined portions of the insulating layer of the second EL element is present in the region in which the first color filter and the second color filter overlap each other when viewed in plan, a large effect of suppressing the color mixing can be produced, which achieves a wide color gamut.

The insulating layer may have a plurality of inclined portions that incline towards the substrate. The inclined portions may overlap the overlapping region when viewed in plan. All the plurality of inclined portions may overlap the overlapping region.

In FIG. 1, when the region (a) in which the first color filter 8R and the second color filter 8G overlap each other when viewed in plan and at least the inclined portion 3A of the insulating layer overlap each other, the color mixing can be suppressed. The inclined portion 3B may also overlap the overlapping region when viewed in plan.

When the luminous efficacy of first light that passes through the first color filter is lower than that of second light that passes through the second color filter, the first color filter may be disposed on the second color filter.

The luminous efficacy is known to be in the order of blue<red<green. That is, when the first color filter is red and the second color filter is green, the red color filter may be disposed on the green color filter.

Structure of Organic EL Element
Substrate

The substrate of the organic EL element according to this embodiment may be a Si substrate, a glass substrate, or a resin substrate. When a Si substrate is employed, a microdisplay apparatus can be provided by forming a transistor on the Si itself. When a glass substrate is employed, a display apparatus may be provided by forming a TFT. A resin substrate may also be referred to as a flexible substrate. When a flexible substrate is employed, a foldable or rollable display apparatus may be provided. The substrate may be transparent or opaque as long as the emission direction of the light-emitting device is not inhibited.

Insulating Layer

The insulating layer of the organic EL element according to this embodiment has inclined portions. The inclined portions incline towards the substrate. FIG. 1 illustrates inclined portions 3A and 3B of the insulating layer 3. However, the inclined portions of the insulating layer are not limited thereto. The inclined portions of the insulating layer can be regarded as different inclined portions by disposing a flat portion or by providing an inflection point at which the sign of the slope changes between the inclined portions.

When the insulating layer has inclined portions, the thickness of the organic compound layer can be decreased at the positions. Since the thinned organic compound layer has high resistance, the leakage of a driving current through the organic EL compound layer between adjacent organic EL elements is suppressed. The leakage of a driving current can be as small as possible to prevent light emission from unintended pixels.

The angle between the insulating layer and the substrate can be set to 60 degrees or more and 90 degrees or less. The insulating layer may have a thickness of 40 nm or more and 150 nm or less. This makes it easy to decrease the thickness of the organic compound layer in the inclined portions of the insulating layer.

The insulating layer may be formed of an inorganic compound or an organic compound. When the insulating layer is formed of an inorganic compound, examples of the inorganic compound include aluminum oxide, silicon oxide, silicon nitride, silicon oxynitride, and mixtures thereof. Layers formed of such an inorganic compound may be stacked on top of each other. When layers formed of different compounds are stacked, layers formed of the same compound may be stacked as different layers by differentiating the density of the layers. When the insulating layer is formed of an organic compound, examples of the organic compound include acrylic resin, amide resin, imide resin, and mixtures thereof.

Electrode

In this embodiment, the lower electrode 2 serves as an anode and the upper electrode 5 serves as a cathode. However, the lower electrode 2 may serve as a cathode and the upper electrode 5 may serve as an anode.

The lower electrode of the organic EL element according to this embodiment can be formed of a metal material having a reflectance of 80% or more. Specifically, the metal material may be a metal such as Al or Ag or an alloy obtained by adding, for example, Si, Cu, Ni, Nd, or Ti to the above metal. Examples of the alloy include AgMg, AlCu, and TiN. The reflectance refers to a reflectance at a wavelength of light emitted from the light-emitting layer. The reflection electrode may include a barrier layer on a surface from which light is emitted. The barrier layer can be formed of a metal such as Ti, W, Mo, or Au or an alloy of the foregoing metals. The alloy may include the above-mentioned alloys.

The upper electrode of the organic EL element according to this embodiment may be a transflective layer that transmits a part of light which has reached the surface and that reflects the other part of light (i.e., semi-transmissive reflectivity). The upper electrode is formed of, for example, a simple metal such as magnesium or silver, an alloy mainly formed of magnesium or silver, or an alloy material containing an alkali metal or an alkaline-earth metal.

When the upper electrode is formed of an alloy, the alloy is, for example, an alloy of magnesium and silver. In the alloy of magnesium and silver, the ratio of magnesium and silver may be 1:1, or either of magnesium or silver may have a larger proportion in terms of at %. When either of magnesium or silver has a larger proportion in terms of at %, silver may have a larger proportion. When silver has a larger proportion in terms of at %, a high transmittance can be achieved. Alternatively, magnesium may have a larger proportion. When magnesium has a larger proportion in terms of at %, good film formation properties can be achieved and thus the film is not easily cut.

A multilayer structure may be employed as long as the upper electrode has a desired transmittance.

Organic Compound Layer

The organic compound layer 4 according to this embodiment may be formed as a shared layer for a plurality of organic EL elements. The shared layer is a layer disposed so as to extend over a plurality of organic EL elements and can be formed by performing a coating method such as spin coating or a deposition method on the entire surface of the substrate.

The organic compound layer 4 according to this embodiment includes at least a light-emitting layer and may be constituted by a plurality of layers. Examples of the plurality of layers include hole injection layers, hole transport layers, electron blocking layers, light-emitting layers, hole blocking layers, and electron transport layers. The organic compound layer emits light through recombination of holes injected from the anode and electrons injected from the cathode in the light-emitting layer.

The light-emitting layer may be constituted by a plurality of layers, and a red-light-emitting material, a green-light-emitting material, and a blue-light-emitting material can be contained in any of the light-emitting layers. By mixing the emission colors, white light can be emitted. Alternatively, white light may be emitted by using light-emitting materials with complementary colors, such as a blue-light-emitting material and a yellow-light-emitting material, in any of the light-emitting layers. The light-emitting layers may be constituted by two layers, three layers, or four or more layers. The plurality of light-emitting layers may each emit light with different colors. A light-emitting layer that emits light with the same color as that of another light-emitting layer may be disposed.

Non-limiting examples of the compound contained in the light-emitting layer include anthracene derivatives, fluorene derivatives, pyrene derivatives, fluoranthene derivatives, chrysene derivatives, triphenylene derivatives, and iridium complexes. These compounds may serve as a host material or a guest material.

Protective Layer

The protective layer of the organic EL element according to this embodiment may be constituted by a single layer or a plurality of layers as long as the protective layer is formed of a material having very low permeability of oxygen and moisture from the outside so as to have sufficient moisture barrier properties. Examples of the protective layer include a silicon nitride (SiN) layer and a silicon oxynitride (SiON) layer formed by a chemical vapor deposition (CVD) method and an aluminum oxide layer, a silicon oxide layer, and a titanium oxide layer formed by an atomic layer deposition (ALD) method. When the protective layer is constituted by a plurality of layers, layers formed of different materials may be stacked or layers formed of the same material but having different densities may be stacked. The protective layer may be selected in consideration of refractive index so that light emitted from the EL element is easily taken out of the device. The protective layer may also be referred to as a sealing layer.

Planarization Layer

The planarization layer of the organic EL element according to this embodiment is a layer for filling the irregularities of the protective layer and can be disposed on the protective layer. This can reduce the amount of light scattered by inclined portions of the irregularities of the protective layer, which can suppress the color mixing. The planarization layer is, for example, a resin layer formed by performing coating.

Color Filter

The color filter of the organic EL element according to this embodiment is formed by applying a color resist on the planarization layer and patterning the color resist by lithography. The color resist is formed of, for example, a photocurable resin, and the pattern is formed by curing portions through irradiation with ultraviolet rays or the like.

In this embodiment, the color filters may be RGB color filters. The RGB color filters may be disposed in a stripe arrangement, a square arrangement, a delta arrangement, or a Bayer arrangement.

FIG. 2 illustrates an example of color filters disposed in a delta arrangement. Red, green, and blue color filters are arranged, and overlapping regions are formed between the color filters.

The filling layer of the organic EL element according to this embodiment is disposed between the color filters and the opposing substrate. The filling layer is formed of an organic material such as an acrylic resin, an epoxy resin, or a silicon resin. A planarization layer may be formed between the color filters and the filling layer. This planarization layer may be the same as or different from the planarization layer disposed between the color filters and the protective layer. When the two planarization layers are formed of the same material, good adhesiveness between the planarization layers can be achieved outside the display region.

The term "outside the display region" refers to a region in which the EL elements are not disposed at the end of the substrate and a region which does not contribute to displaying.

Opposing Substrate

The opposing substrate of the organic EL element according to this embodiment may be a transparent substrate. The opposing substrate may be, for example, a transparent glass substrate or a transparent plastic substrate.

The opposing substrate of the organic EL element according to this embodiment is disposed above the color filter of each color with the filling layer disposed therebetween. The opposing substrate may have a flat upper surface. The flat surface refers to a surface that is parallel to the substrate 1, and errors in production are considered for the term "parallel". When the interfaces of the structure above the color filter are flat, light emitted in a direction oblique to the substrate is prevented from being emitted in a direction perpendicular to the substrate.

In general, in an organic EL light-emitting device including color filters, light emitted in an oblique direction tends to pass through the adjacent color filters. When the interfaces of the structure above the color filters are flat, the light is emitted in the oblique direction to the outside of the light-emitting device or is subjected to total reflection at the interface to become guided light. However, if the interface has irregularities, the light is scattered at the interface and also emitted in a direction perpendicular to the substrate, which may cause the color mixing. In particular, the interface with the air where the difference in refractive index between the upper and lower materials tends to be large is desirably flat. Therefore, the flat upper surface of the opposing substrate is effective for suppressing the color mixing.

Second Embodiment

A light-emitting device according to this embodiment is the same as that in the first embodiment, except that an inclined portion disposed on the second EL element side among inclined portions of the insulating layer of the second EL element does not overlap, when viewed in plan, the overlapping region in which a plurality of color filters overlap each other. In this embodiment, in FIG. 1, the inclined portion 3A of the insulating layer is disposed in the region ($\alpha$) in which the first color filter 8R and the second color filter 8G overlap each other when viewed in plan, but the inclined portion 3B is not disposed in the region ($\alpha$).

The light-emitting device according to this embodiment can produce an effect of suppressing the color mixing and achieve high light emission efficiency. This is because the light emitted from the second organic EL element 100G in an upward direction is not shielded by the first color filter.

The light-emitting device according to this embodiment is a light-emitting device having high light emission efficiency because the area from which light is emitted is large.

Third Embodiment

The protective layer of an organic EL element according to this embodiment has inclined portions on the upper surface thereof in reflection of the underlying shape derived from the irregularities of the insulating layer. Except for that, the third embodiment is the same as the first or second embodiment.

The protective layer has inclined portions 6A and 6B of the protective layer in FIG. 1. An inclined portion closest to the first organic EL element among the inclined portions of the protective layer can be provided in a region in which the color filter 8R and the color filter 8G overlap each other when viewed in plan. That is, the inclined portion 6A can be disposed in the region (a) in which the color filter 8R and the color filter 8G overlap each other when viewed in plan. Thus, light scattered at the inclined portions of the protective layer can be shielded so that the light is not emitted to the outside of the device, which can suppress the color mixing. The definition of the inclined portions of the protective layer is the same as that of the inclined portions of the insulating layer.

Fourth Embodiment

In a light-emitting device according to this embodiment, the protective layer 6 may have a low-density region therein. The low-density region of the protective layer is a region having a lower atomic density than the surrounding portion. The low-density region may be a cavity in the protective layer. The fourth embodiment may be the same as the first, second, or third embodiment, except that the protective layer has a low-density region.

For the protective layer such as a silicon nitride (SiN) layer or a silicon oxynitride (SiON) layer formed by a chemical vapor deposition (CVD) method, when the underlying shape has irregularities, the low-density region may be formed in the protective layer using the irregularities.

When the protective layer has a cavity, the low-density region of the protective layer can be disposed in the region in which the color filter 8R and the color filter 8G overlap each other when viewed in plan. Thus, light scattered in the low-density region of the protective layer can be shielded, which can suppress the color mixing.

Furthermore, the entire low-density region of the protective layer can be disposed in the region in which the color filter 8R and the color filter 8G overlap each other when viewed in plan.

Fifth Embodiment

A light-emitting device according to this embodiment may be the same as that in any one of the first to fourth embodiments, except that the color filter 8R has a different shape.

Figure 3:
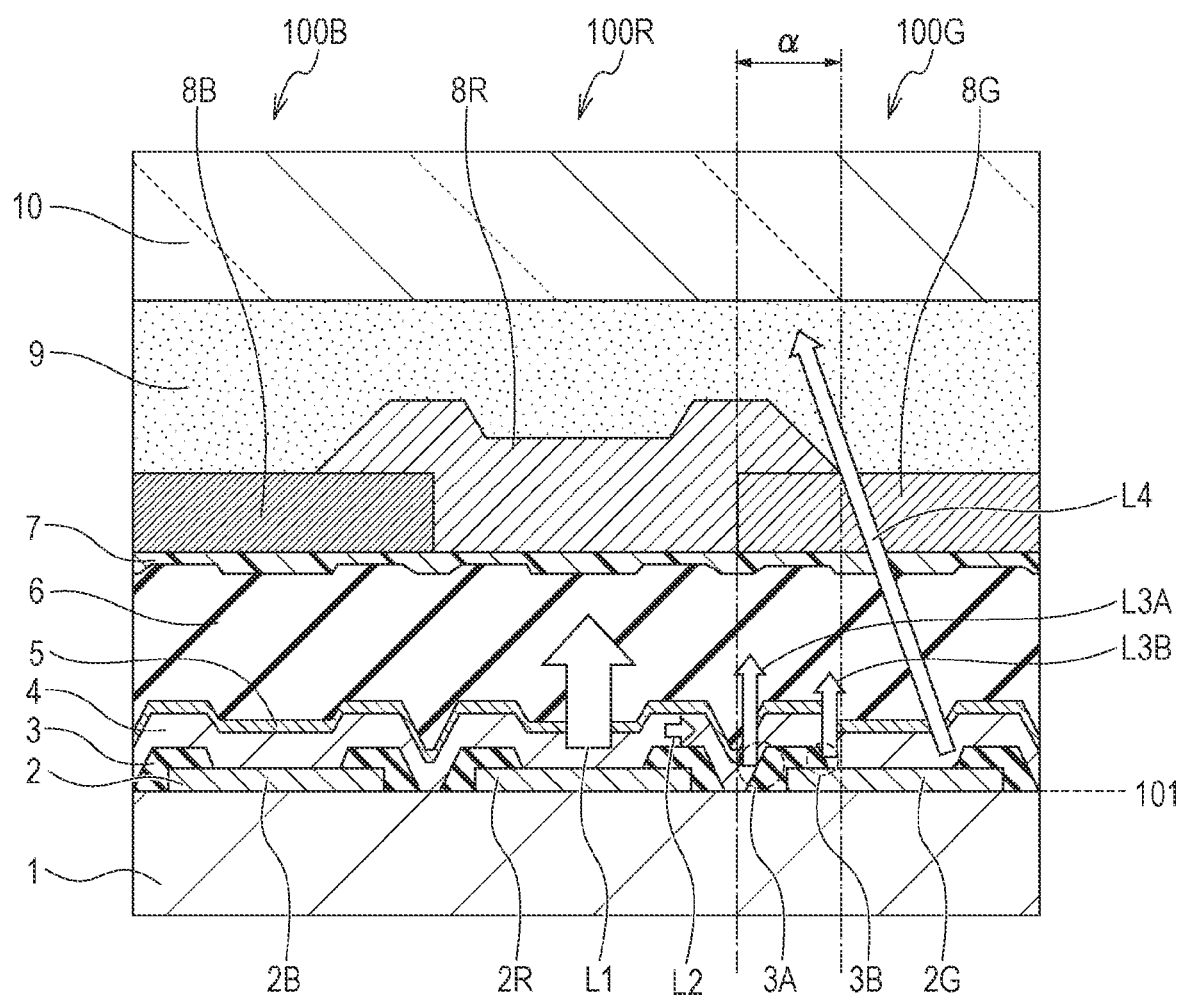
FIG. 3 schematically illustrates a shape of a color filter of a light-emitting device according to an embodiment of the present invention.

FIG. 3 is a schematic sectional view illustrating a light-emitting device according to this embodiment. The same reference numerals as those in FIG. 1 indicate the same constituent elements.

As illustrated in FIG. 3, the color filter 8R of the light-emitting device according to this embodiment has a thicker area in a region in which the color filter 8R and the color filter 8G overlap each other when viewed in plan. The presence of the thicker area further suppresses the color mixing.

As the thickness of the color filter 8R in the region ($\alpha$) in which the color filter 8R and the color filter 8G overlap each other when viewed in plan is increased, the amount of light absorbed in the region is increased by the Lambert-Beer's law. Thus, a larger amount of scattered light L3A and scattered light L3B can be absorbed, which can suppress the color mixing.

The thickness of the color filter 8R at the uppermost position in the region ($\alpha$) in which the color filter 8R and the color filter 8G overlap each other when viewed in plan can be set to 0.4 µm or more and 1.5 µm or less. This can provide a light-emitting device in which the color mixing is suppressed and which has good viewing angle characteristics.

On the other hand, the thickness of the color filter 8R can be set to be as small as possible in a region in which the organic EL element 100R and the color filter 8R overlap each other when viewed in plan because high light emission efficiency is achieved. This is because the amount of light absorbed is small when light passes through the color filter.

The thickness of the color filter in the light-emitting device can be increased in a region for suppressing the color mixing and can be set to be as small as possible in a region that serves as the original function of the color filter, such as the selection of a wavelength of transmitted light. By appropriately adjusting the thickness, light L1 can be emitted from the organic EL element 100R with high intensity.

The shape of the color filter 8R according to this embodiment can be formed by a publicly known method. Examples of the method include, after formation of the color filter 8G and the color filter 8B, appropriate control of the rotational speed of a spin coater used when a color resist of the color filter 8R is applied and appropriate control of the viscosity of a color resist material for the color filter 8R. Alternatively, after formation of the color filter 8R, the thickness of a central portion of the color filter 8R may be decreased by performing etching or the like.

In the light-emitting device according to this embodiment, the shape of the color filter 8R is a forward tapered shape toward the organic EL element 100G in the region in which the color filter 8R and the color filter 8G overlap each other when viewed in plan.

Figure 4:
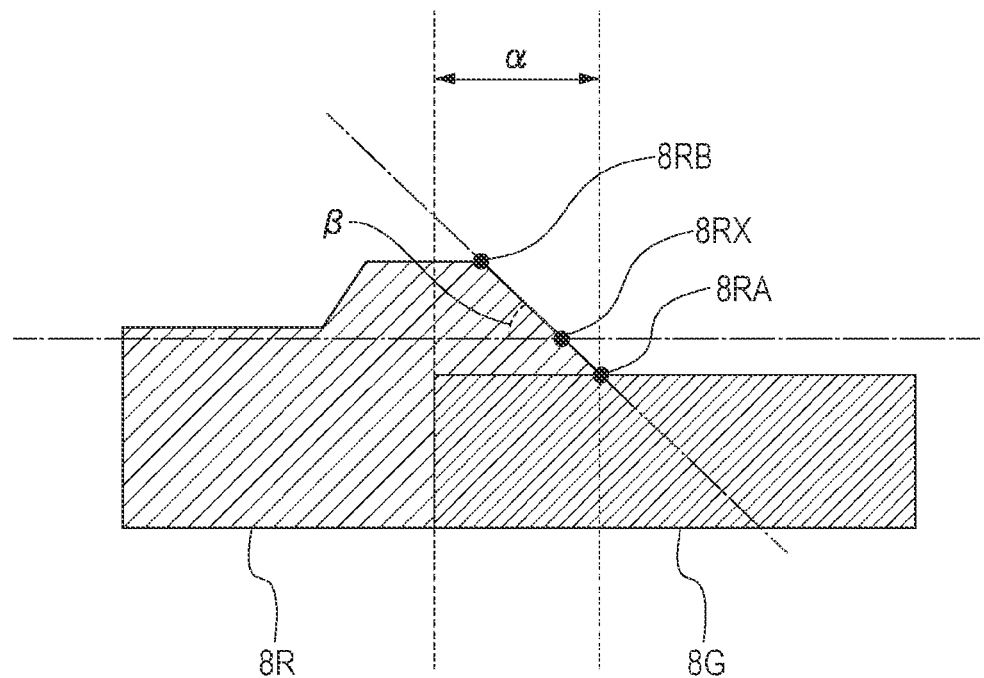
FIG. 4 is a schematic sectional view illustrating an example of the light-emitting device according to an embodiment of the present invention.

The shape of the color filter 8R according to this embodiment will be described in detail with reference to FIG. 4. Attention is paid to a point 8RA closest to the organic EL element 100G at the bottom of the color filter 8R and a point 8RB at which the color filter 8R has the largest thickness in the region ($\alpha$) in which the color filter 8R and the color filter 8G overlap each other when viewed in plan. The forward tapered shape according to this embodiment is a shape in which the taper angle ($\beta$) between a tangent line at an arbitrary point 8RX on the upper surface of the first color filter 8R between the point 8RA and the point 8RB and a line parallel to the substrate is less than 90 degrees.

Thus, light emitted in an oblique direction from the organic EL element 100G in FIG. 3 is emitted to the outside of the device without being subjected to vignetting by the first color filter 8R. That is, a light-emitting device having good viewing angle characteristics can be provided. The term "good viewing angle characteristics" refers to a small difference between light emitted in a front direction of the light-emitting device and light emitted in the oblique direction. The small difference of light means that the difference in intensity and color of light is small.

When the end portion of the color filter 8R has a forward tapered shape, an inclined portion closest to the organic EL element 100R among inclined portions of the insulating layer in the region in which the color filter 8R and the color filter 8G overlap each other when viewed in plan tends to be disposed in an area where the color filter 8R has a large thickness in the overlapping region.

The tapered shape of the color filter 8R can be formed by appropriately setting the amount of exposure during curing of the color filter 8R and the position of an exposure light source during exposure when the color filter 8R is formed after formation of the color filter 8G and the color filter 8B.

According to the light-emitting device of this embodiment, a light-emitting device in which the color mixing is suppressed and which has good viewing angle characteristics can be provided.

Other Embodiments

An insulating layer according to an embodiment and the adjacent insulating layer may be disposed in a horizontal manner. This means that the upper surface of an insulating layer extends to the adjacent insulating layer at the same height.

In this case, since the inclined portion 3A of the insulating layer in FIG. 1 is not formed and only the inclined portion 3B is formed, the inclined portion 3B serves as an inclined portion closest to the first organic EL element.

The insulating layer between the first organic EL element and the second organic EL element in the region in which the color filter 8R and the color filter 8G overlap each other when viewed in plan may have a plurality of inclined portions. This can widen a region in which the organic compound layer is thin, and thus the leakage of current to adjacent pixels is easily suppressed.

FIG. 1 illustrates a region in which the color filter 8R and the color filter 8G overlap each other and a region in which the color filter 8R and the color filter 8B overlap each other. The light-emitting device according to an embodiment may also have a region in which the color filter 8G and the color filter 8B overlap each other. This can further suppress the color mixing.

In FIG. 1, the color filter 8R is disposed on the color filter 8G, but the color filter 8G may be disposed on the color filter 8R.

In FIG. 1, the end portion of the color filter 8G on the organic EL element 100R side is located near the intermediate point between the organic EL element 100R and the organic EL element 100G. The end portion of the color filter 8G on the organic EL element 100R side may be located closer to the organic EL element 100R with respect to the intermediate point between the organic EL element 100R and the organic EL element 100G. This is because the insulating layer of the organic EL element 100R on the organic EL element 100G side is included, when viewed in plan, in the region in which the color filter 8R and the color filter 8G overlap each other. This can also suppress the color mixing caused when the second organic EL element 100G emits light.

In the present invention, the combination of colors between the first color filter 8R, the second color filter 8G, and the third color filter 8B is not limited to the above-described combination.

In the present invention, the first color filter 8R and the second color filter 8G do not necessarily contact each other as long as they overlap each other when viewed in plan, but may contact each other to suppress the color mixing.

Apparatus including light-emitting device according to embodiment of the present invention The light-emitting device according to an embodiment of the present invention may be included in a display apparatus that includes an active element such as a transistor. The display apparatus includes a horizontal drive circuit, a vertical drive circuit, and a display section that includes the light-emitting device according to an embodiment of the present invention.

Figure 5:
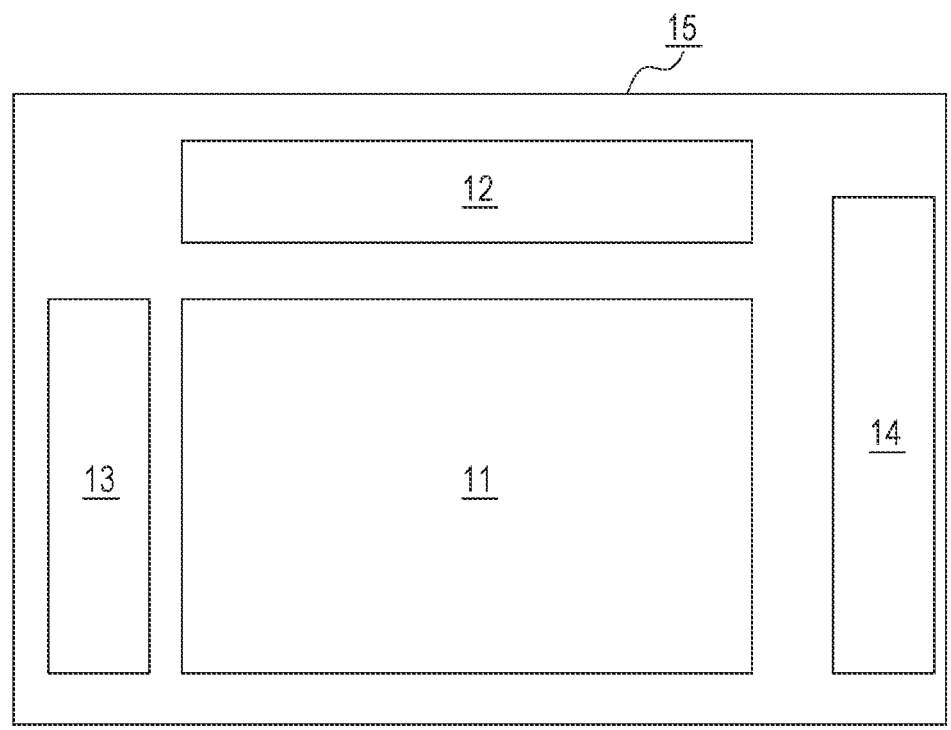
FIG. 5 is a schematic plan view illustrating an example of a display apparatus according to an embodiment of the present invention.

FIG. 5 schematically illustrates an example of the display apparatus according to this embodiment. The display apparatus 15 includes a display region 11, a horizontal drive circuit 12, a vertical drive circuit 13, and a connecting section 14. The display region may include the light-emitting device according to an embodiment of the present invention.

The display apparatus according to this embodiment may be used in a display section of an image forming apparatus such as a multifunction printer or an inkjet printer. In this case, the display apparatus may have both a display function and an operating function.

Figure 7:
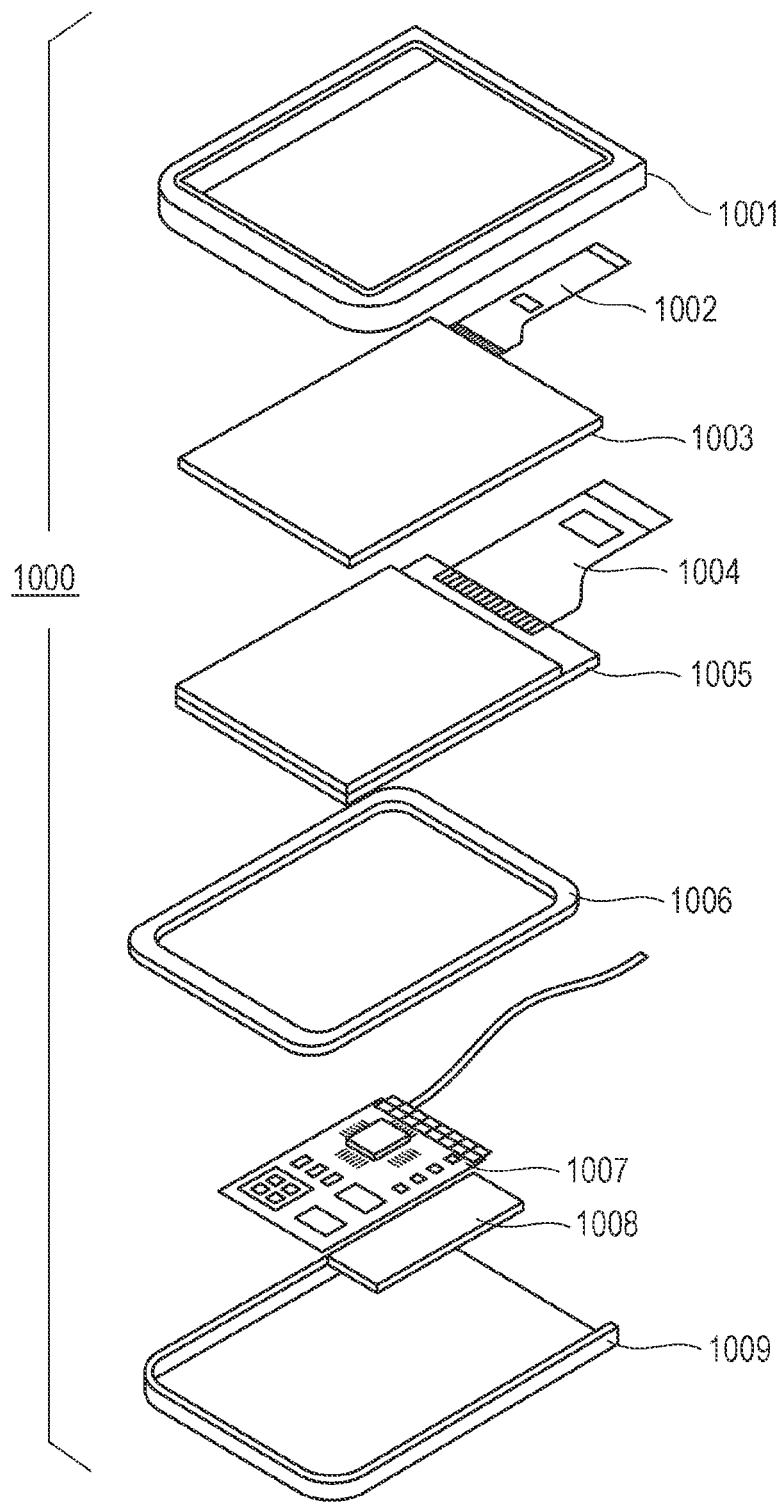
FIG. 7 schematically illustrates an example of a display apparatus according to this embodiment.

FIG. 7 schematically illustrates an example of the display apparatus according to this embodiment. The display apparatus 1000 may include a touch panel 1003, a display panel 1005, a frame 1006, a circuit board 1007, and a battery 1008 between an upper cover 1001 and a lower cover 1009. Flexible printed circuits FPC 1002 and 1004 are connected to the touch panel 1003 and the display panel 1005, respectively. A transistor is printed on the flexible printed circuits FPC 1002 and 1004. The battery 1008 is not necessarily disposed if the display apparatus is not a mobile apparatus. Even if the display apparatus is a mobile apparatus, the battery 1008 is not necessarily disposed at this position.

The display apparatus according to this embodiment may be used in a display section of an image pickup apparatus, such as a camera, that includes an optical system including a plurality of lenses and an image pickup element configured to receive light that has passed through the optical system. The image pickup apparatus may include a display section configured to display information obtained by the image pickup element. The display section may be a display section exposed to the outside of the image pickup apparatus or a display section disposed in a viewfinder.

Figure 8:
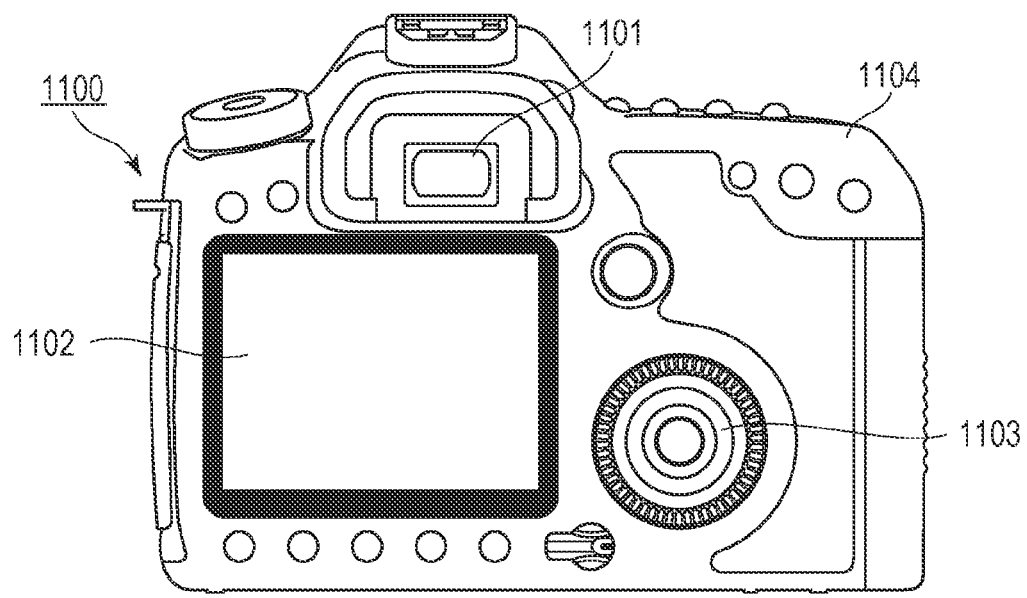
FIG. 8 schematically illustrates an example of an image pickup apparatus according to this embodiment.

FIG. 8 schematically illustrates an example of an image pickup apparatus according to this embodiment. An image pickup apparatus 1100 may include a viewfinder 1101, a rear display 1102, an operating section 1103, and a housing 1104. The viewfinder 1101 may include the display apparatus according to an embodiment of the present invention. In this case, the display apparatus may display not only an image to be captured, but also environmental information, image capturing instructions, and the like. The environmental information may be, for example, the intensity of external light, the direction of external light, the moving speed of a subject, and the possibility that the subject is hidden by an object.

Since the timing appropriate for capturing an image is only a moment, the information is desirably displayed as quickly as possible. Therefore, the display apparatus including the organic EL element according to an embodiment of the present invention can be used. This is because the organic EL element has a high response speed. The display apparatus including the organic EL element can be more suitably used than such an apparatus and liquid crystal display apparatuses that are required to have a high display speed.

The image pickup apparatus 1100 includes an optical section (not illustrated). The optical section includes a plurality of lenses and focuses an image on the image pickup element accommodated in the housing 1104. By adjusting the relative positions of the plurality of lenses, the focal point can be adjusted. This operation can also be performed automatically.

The display apparatus according to this embodiment may include red, green, and blue color filters. The red, green, and blue color filters may be disposed in a delta arrangement.

The display apparatus according to this embodiment may be used in a display section of mobile terminals. In this case, the display apparatus may have both a display function and an operating function. Examples of the mobile terminals include cellular phones such as smart phones, tablets, and head mount displays. They are also called telecommunications apparatuses or electronic apparatuses.

Figure 9:
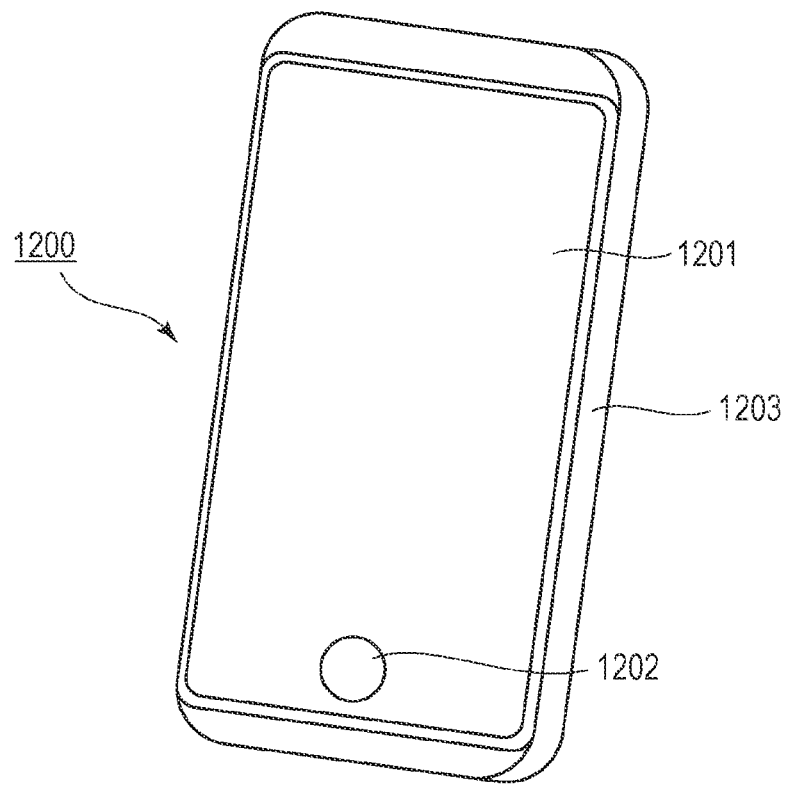
FIG. 9 schematically illustrates an example of a mobile apparatus according to this embodiment.

FIG. 9 schematically illustrates an example of a mobile apparatus according to this embodiment. A mobile apparatus 1200 includes a display section 1201, an operating section 1202, and a housing 1203. The housing 1203 may include a circuit, a printed board including the circuit, a battery, and a communications section. The operating section 1202 may be a button or a touch panel response section. The operating section may be a biometric recognition section that releases a lock through recognition of fingerprints.

Figure 10A:
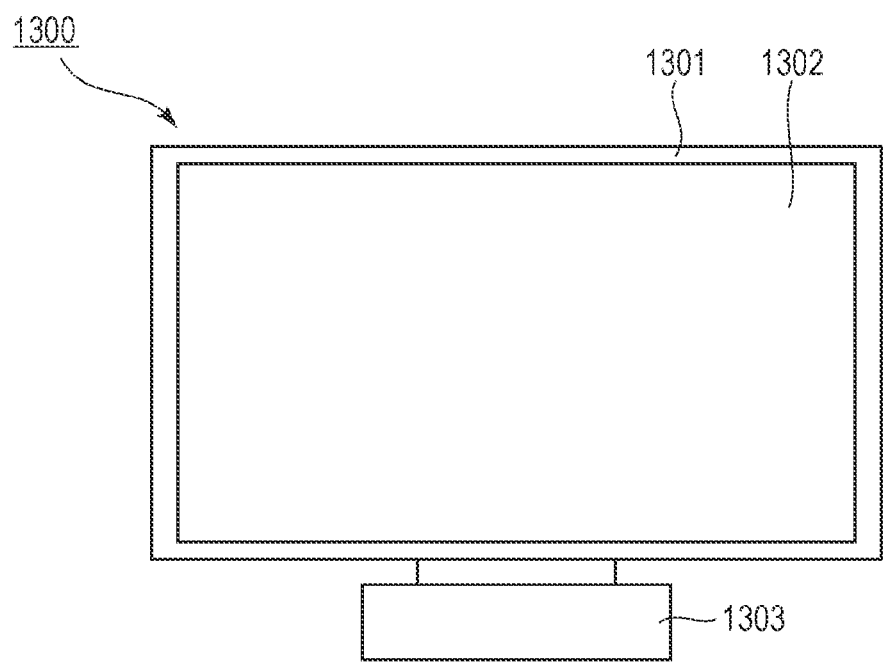
FIG. 10A schematically illustrates an example of a display apparatus according to this embodiment and FIG. 10B schematically illustrates an example of a foldable display apparatus.
Figure 10B:
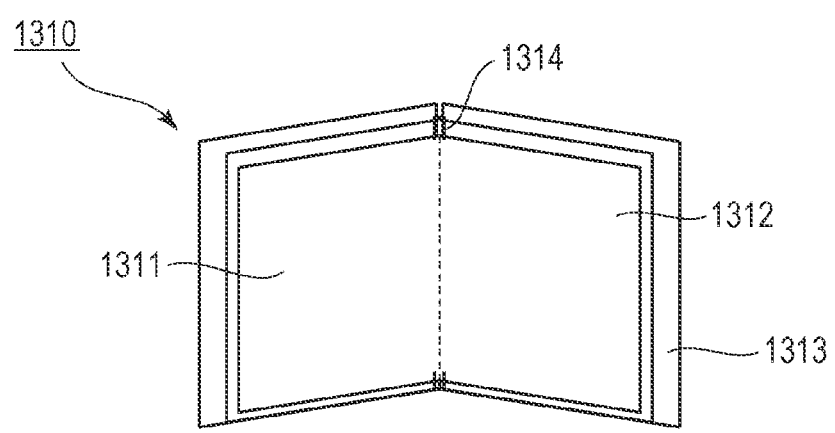

FIGS. 10A and 10B schematically illustrate examples of display apparatuses according to this embodiment. FIG. 10A illustrates a display apparatus such as a television monitor or a PC monitor. A display apparatus 1300 includes a frame 1301 and a display section 1302. The light-emitting device according to an embodiment of the present invention may be used in the display section 1302.

The display apparatus 1300 includes a base 1303 that supports the frame 1301 and the display section 1302. The form of the base 1303 is not limited to that in FIG. 10A. The lower side of the frame 1301 may also serve as a base.

The frame 1301 and the display section 1302 may be curved. The radius of curvature may be 5000 mm or more and 6000 mm or less.

FIG. 10B schematically illustrates another example of a display apparatus according to this embodiment. A display apparatus 1310 in FIG. 10B is a so-called foldable display apparatus. The display apparatus 1310 includes a first display section 1311, a second display section 1312, a housing 1313, and a bending point 1314. The first display section 1311 and the second display section 1312 may include the light-emitting device according to an embodiment of the present invention. The first display section 1311 and the second display section 1312 may be included in a single seamless display apparatus. The first display section 1311 and the second display section 1312 can be divided by the bending point. The first display section 1311 and the second display section 1312 may display different images or the first and second display sections may display a single image.

EXAMPLES

Example 1

The light-emitting device illustrated in FIG. 3 was provided as follows.

As illustrated in FIG. 3, lower electrodes 2 were formed on a substrate in a patterned manner, and insulating layers 3 were formed between the electrodes. Each of the insulating layers was formed of a silicon oxide film and had a thickness of 65 nm. The taper angle of an inclined portion of the insulating layer on the pixel opening side was set to 80° and the taper angle of an inclined portion of the insulating layer between pixels was set to 75°. The pixels were formed in a delta arrangement, and the distance between pixel openings of adjacent pixels was set to 1.4 μm and the distance between the lower electrodes was set to 0.6 μm.

Red, green, and blue color filters were disposed in a delta arrangement. The end portion of the green color filter 8G on the organic EL element 100R side was disposed at an intermediate point between the pixel openings of the lower electrodes of the first organic EL element 11R and the second organic EL element 11G. The end portion of the first red color filter 8R was disposed so as to overlap the second color filter 8G with a distance of 0.8 μm. Thus, inclined portions 3A and 3B of the insulating layer were formed in a region in which the red color filter 8R and the green color filter 8G overlapped each other when viewed in plan.

The thicknesses of the first color filter 8R, the second color filter 8G, and the third color filter 8B in regions in which the color filters and the corresponding organic EL elements overlapped each other when viewed in plan were 2.0 μm, 1.5 μm, and 1.5 μm, respectively. The thickness of the first color filter 8R at the highest position in a region (a) in which the first color filter 8R and the second color filter 8G overlapped each other when viewed in plan was 0.7 μm, and the level of the position was higher than that of the first color filter 8R in a region in which the first color filter 8R and the first organic EL element 100R overlapped each other when viewed in plan.

The taper angle of the first color filter 8R from the end portion of the first color filter 8R on the green pixel side to the top was 10° to 70° so that the first color filter 8R had a forward tapered shape.

The relationship between the first color filter 8R and the third blue color filter 8B was the same as the relationship between the first color filter 8R and the second color filter 8G.

A hole injection layer formed of the following compound 1 was formed on a reflection electrode so as to have a thickness of 3 nm.

A hole transport layer formed of the following compound 2 was formed so as to have a thickness of 15 nm, and an electron blocking layer formed of the following compound 3 was formed so as to have a thickness of 10 nm. A first light-emitting layer containing 97 wt % of the following compound 4 as a host material and 3 wt % of the following compound 5 as a light-emitting dopant was formed so as to have a thickness of 10 nm. A second light-emitting layer containing 98 wt % of the following compound 4 as a host material and 1 wt % of the following compound 6 and 1 wt % of the following compound 7 as light-emitting dopants was formed so as to have a thickness of 10 nm.

An electron transport layer formed of the following compound 8 was formed so as to have a thickness of 110 nm. An electron injection layer formed of LiF was formed so as to have a thickness of 0.5 nm. An upper electrode formed of a MgAg alloy was formed so as to have a thickness of 10 nm. The ratio of Mg and Ag was set to 1:1. Then, a SiN film serving as a protective layer was formed by a CVD method so as to have a thickness of 1.5 μm.

Compound 1

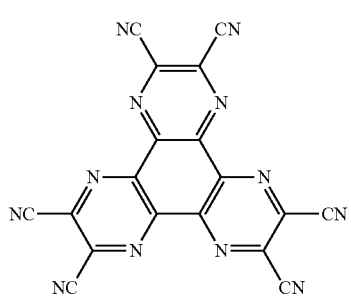

Compound 2

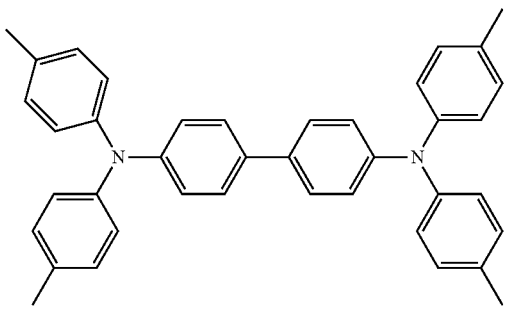

Compound 3

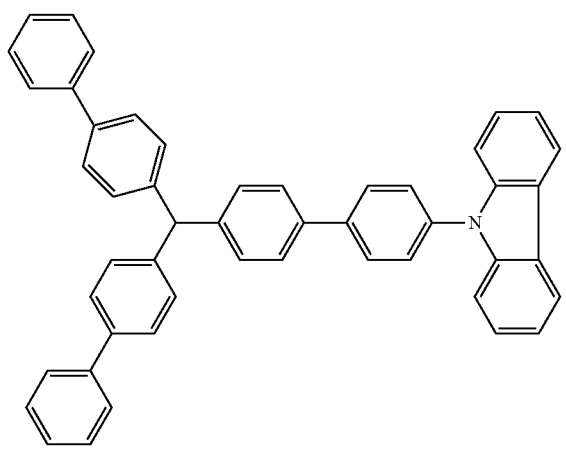

-continued

Compound 4

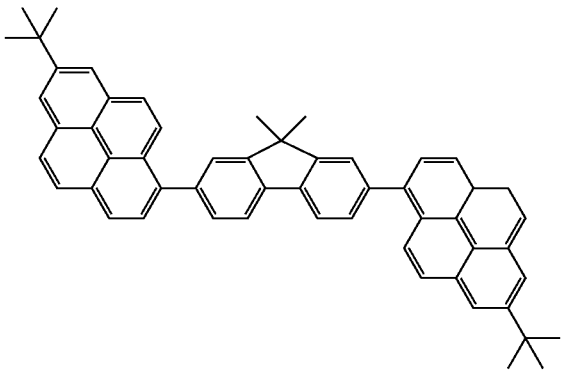

Compound 5

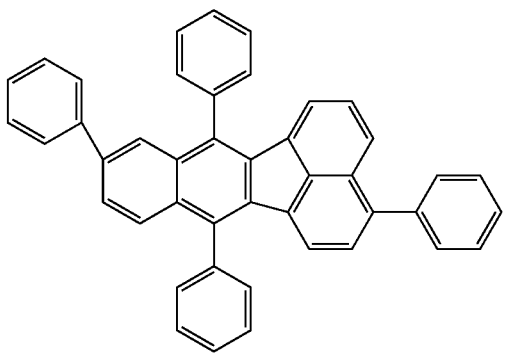

Compound 6

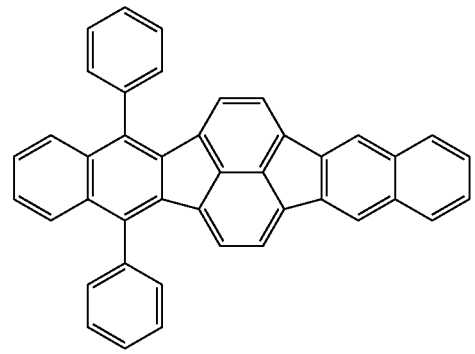

Compound 7

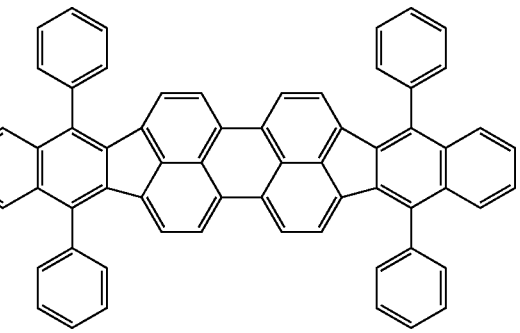

Compound 8

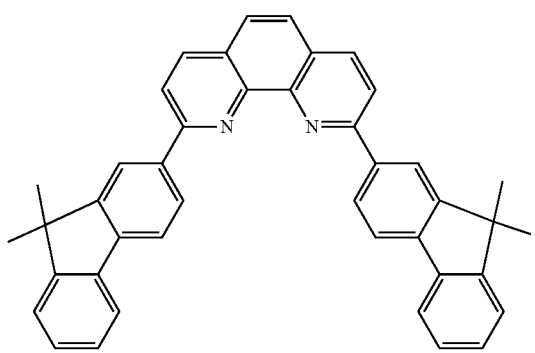

An opposing substrate 10 formed of glass and having upper and lower flat surfaces was formed, and a filling layer formed of a photo-curable epoxy resin was disposed between the opposing substrate 10 and the color filters.

A voltage was applied at a current density of 100 mA/cm$^2$ to only the red pixel of the produced light-emitting device. The light emitted in a direction perpendicular to the substrate was detected using a spectroradiometer to evaluate the chromaticity.

Example 2

The same light-emitting device as in Example 1 was produced, except that the width of regions of the first color filter 8R that overlapped the second color filter 8G and the third color filter 8B was changed to 0.5 µm. Consequently, the region in which the red color filter 8R and the green color filter 8G overlapped each other when viewed in plan overlapped the inclined portion 3A of the insulating layer, but did not overlap the inclined portion 3B of the insulating layer.

Comparative Example 1

The same light-emitting device as in Example 1 was produced, except that the width of regions of the first color filter 8R that overlapped the second color filter 8G and the third color filter 8B was changed to 0.2 µm. Consequently, the region in which the red color filter 8R and the green color filter 8G overlapped each other when viewed in plan did not overlap either the inclined portion 3A or the inclined portion 3B of the insulating layer.

Table 1 shows the evaluation results of the light-emitting devices in Examples 1 and 2 and Comparative Example 1. When light was emitted from the red pixel of each of the light-emitting devices, the chromaticity coordinates (u', v') in the u'v' space were measured, and the difference from u' in Comparative Example 1 was determined as Δu'. A larger value of Δu' means a red color with a higher color purity, which can provide a display apparatus having high color reproducibility.

TABLE 1

|  | Δu' |
| --- | --- |
| Example 1 | +0.008 |
| Example 2 | +0.005 |
| Comparative Example 1 | 0 |

As is clear from the comparison between Example 2 and Comparative Example 1, when at least an inclined portion closest to the first organic EL element among inclined portions that overlap the second color filter when viewed in plan is in a region in which the first color filter and the second color filter overlap each other when viewed in plan as in Example 2, a large effect of suppressing the color mixing can be produced and a high color purity can be achieved.

Furthermore, when all inclined portions of the insulating layer between the first organic EL element and the second organic EL element in a region in which the insulating layer and the second color filter overlap each other when viewed in plan are in the region in which the first color filter and the second color filter overlap each other when viewed in plan as in Example 1, the color mixing can be further suppressed, which can achieve a higher color purity.

Comparative Example 2

For verification, the same light-emitting device as in Example 1 was produced, except that the color filters, the filling layer 9, and the opposing substrate 10 were not disposed. A voltage was applied at a current density of 100 mA/cm$^2$ to only the first organic EL element 100R of the produced light-emitting device. The image data in the light emission state of a light-emitting pixel and the adjacent pixel was obtained with a digital camera using an optical system of a microscope.

Figure 6:
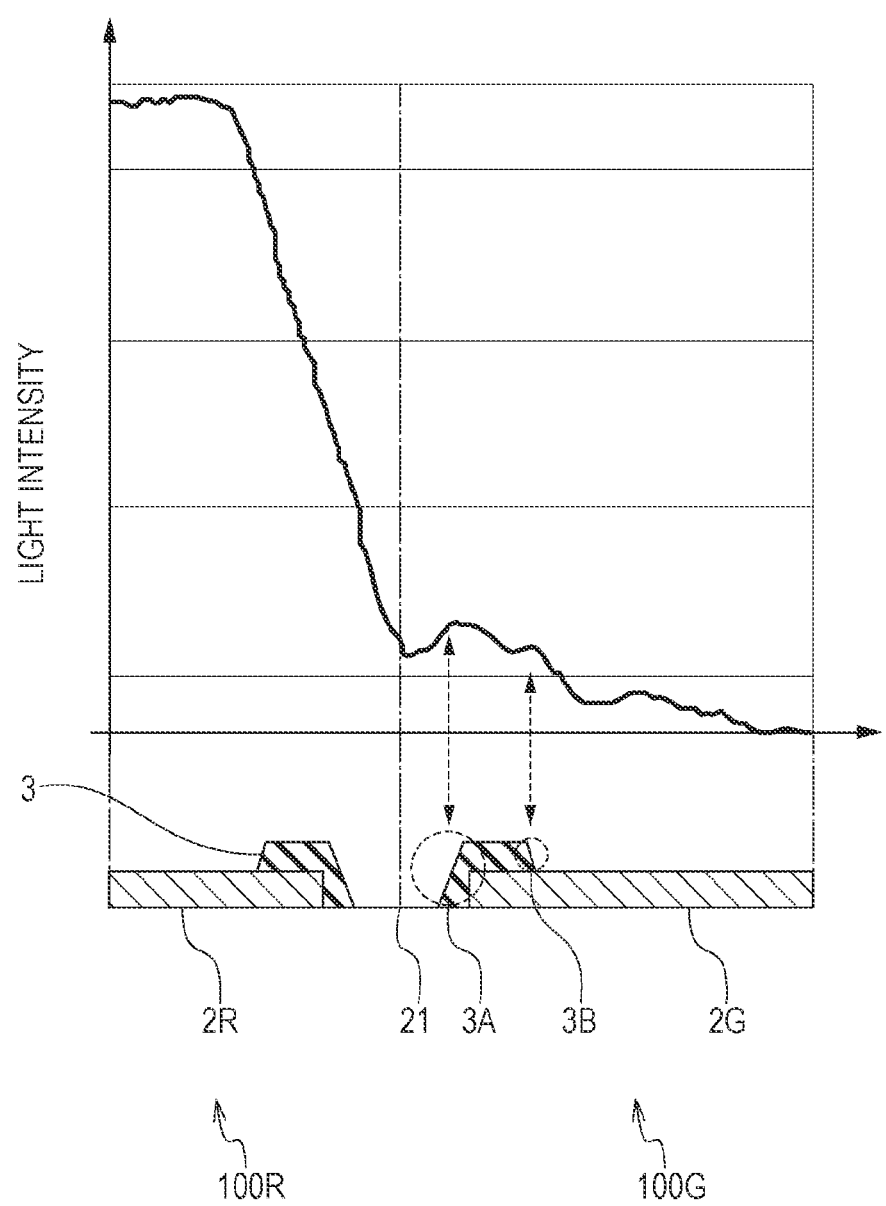
FIG. 6 illustrates the distribution of light intensity of a light-emitting device for verification.

FIG. 6 illustrates the gradation of a white color of the image data in a linear region from the first organic EL element 100R to the second organic EL element 100G. The light intensity increases as the gradation on the vertical axis increases. FIG. 6 also schematically illustrates the substrate on the horizontal axis, the first lower electrode 2R and the second lower electrode 2G of the light-emitting device corresponding to positions in the horizontal direction, and the insulating layers 3 formed between the first lower electrode 2R and the second lower electrode 2G. As is clear from FIG. 6, when light is emitted from the first organic EL element 100R, the emitted light is also detected in a region closer to the second organic EL element 100G with respect to the intermediate position 21 between the first organic EL element 100R and the second organic EL element 100G. In particular, the light intensity has peaks at positions of the inclined portion 3A and the inclined portion 3B of the insulating layer 3, and the peaks are believed to be derived from scattered light at the inclined portions. In particular, the light intensity is found to be high in the inclined portion 3A. This supports that the inclined portion closer to the first organic EL element generates stronger scattered light. Therefore, when at least an inclined portion closest to the first organic EL element among inclined portions that overlap the second color filter when viewed in plan is in a region in which the first color filter and the second color filter overlap each other when viewed in plan as in Example 2, a large effect of suppressing the color mixing can be produced.

As described above, a display apparatus in which the occurrence of color mixing at the adjacent color pixels is suppressed and which has high color reproducibility can be provided by using the light-emitting device according to an embodiment of the present invention.

According to the present invention, a display apparatus in which the occurrence of color mixing at the adjacent color pixels is suppressed and which has high color reproducibility can be provided.

While the present invention has been described with reference to exemplary embodiments, it is to be understood that the invention is not limited to the disclosed exemplary embodiments.

What is claimed is:

1. A light-emitting device comprising:
   a substrate;
   a plurality of lower electrodes disposed over the substrate:
   a light-emitting layer disposed over at least of the plurality of lower electrodes;
   an upper electrode disposed over the light-emitting layer;
   a color filter layer disposed over the upper electrode; and
   an insulating layer disposed between the plurality of lower electrodes and the light-emitting layer so as to cover an end portion of each of the plurality of lower electrodes,
   wherein the plurality of lower electrodes includes a first lower electrode and a second lower electrode adjacent to each other,
   wherein the color filter layer includes a first color filter disposed over the first lower electrode and a second color filter disposed over the second lower electrode, the first color filter and the second color filter being arranged so as to partially overlap each other, in an overlapping region, when viewed in a plan view of the light emitting device when viewed in a direction perpendicular to a main surface of the substrate,
   wherein the insulating layer includes a first portion disposed over the first lower electrode, a second portion disposed between the first lower electrode and the second lower electrode, and a third portion disposed over the second lower electrode, when viewed in the plan view,
   wherein the first portion includes a first inclined portion, the second portion includes a plurality of inclined portions including a second inclined portion, and the third portion includes a third inclined portion,
   wherein the second inclined portion is closest to the second lower electrode among the plurality of inclined portions included in the second portion,
   wherein the second inclined portion overlaps the overlapping region, when viewed in the plan view, and
   wherein the first inclined portion does not overlap the overlapping region, when viewed in the plan view.

2. The light-emitting device according to claim 1,
   wherein a luminous efficacy of light that passes through the first color filter is lower than that of light that passes through the second color filter, and
   wherein the first color filter is disposed over the second color filter in the overlapping region.

3. The light-emitting device according to claim 1, wherein the first color filter is a red color filter and the second color filter is a green color filter.

4. The light-emitting device according to claim 1, wherein the first inclined portion is closest to a region where the first lower electrode is in contact with the light-emitting layer among the inclined portions included in the first portion, the second portion and the third portion.

5. The light-emitting device according to claim 1, wherein, in the overlapping portion, the first color filter includes an inclined portion having a forward tapered shape toward an end portion of the overlapping portion.

6. The light-emitting device according to claim 1, wherein the first inclined portion, the second inclined portion, and the third inclined portion are inclined to the main surface of the substrate on a cross section perpendicular to the main surface of the substrate.

7. The light-emitting device according to claim 6, wherein an angle formed between the first inclined portion, the second inclined portion and the third inclined portion, and the main surface of the substrate on a cross section perpendicular to the main surface is 60 degrees or more and less than 90 degrees.

8. The light-emitting device according to claim 1, wherein the insulating layer is formed of an inorganic compound.

9. The light-emitting device according to claim 1, further comprising:
   a protective layer disposed between the upper electrode and the color filter layer,
   wherein the protective layer includes inclined portions in a region in which the protective layer and the second color filter overlap each other when viewed in said plan view, and
   wherein an inclined portion disposed between an end portion of the first lower electrode and an end portion of the second lower electrode and closest to the second lower electrode, among the inclined portions included in the protective layer, overlaps the overlapping region of the color filter when viewed in the plan view.

10. The light-emitting device according to claim 1, further comprising:
    a protective layer disposed between the upper electrode and the color filter layer,
    wherein the protective layer is continuously disposed over the first lower electrode and the second lower electrode,
    wherein the protective layer includes a low-density region, and
    wherein the low-density region overlaps said overlapping region when viewed in said plan view.

11. The light-emitting device according to claim 1, further comprising:
    a protective layer disposed between the upper electrode and the color filter layer,
    wherein the protective layer is continuously disposed over the first lower electrode and the second lower electrode,
    wherein the protective layer includes a cavity, and
    wherein the cavity overlaps said overlapping region when viewed in said plan view.

12. The light-emitting device according to claim 1, wherein all of the inclined portions included in the second portion overlap the overlapping region when viewed in said plan view.

13. The light-emitting device according to claim 1, wherein the third inclined portion overlaps the overlapping region when viewed in the plan view.

14. The light-emitting device according to claim 1, wherein the light-emitting layer contains an organic compound.

15. The light-emitting device according to claim 1, further comprising an opposing substrate disposed over the opposite side of the color filters from said substrate,
    wherein a resin layer is disposed between the color filters and the opposing substrate.

16. A display apparatus comprising:
    the light-emitting device according to claim 1; and
    an active element connected to the light-emitting device.

17. An image pickup apparatus comprising:
    an optical section including a plurality of lenses;
    an image pickup element configured to receive light that has passed through the optical section; and
    a display section configured to display an image captured by the image pickup element and including the light-emitting device according to claim 1.

18. A communications apparatus comprising:
a display section; and
a communications section,
wherein the display section includes the light-emitting device according to claim 1.

19. A light-emitting device comprising:
a substrate;
a plurality of lower electrodes disposed over the substrate:
a light-emitting layer disposed over at least of the plurality of lower electrodes;
an upper electrode disposed over the light-emitting layer;
a color filter layer disposed over the upper electrode;
an insulating layer disposed between the plurality of lower electrodes and the light-emitting layer so as to cover an end portion of each of the plurality of lower electrodes; and
a protective layer disposed between the upper electrode and the color filter layer,
wherein the plurality of lower electrodes includes a first lower electrode and a second lower electrode adjacent to each other,
wherein the color filter layer includes a first color filter disposed over the first lower electrode and a second color filter disposed over the second lower electrode, the first color filter and the second color filter being arranged so as to partially overlap each other, in an overlapping region, when viewed in a plan view of the light emitting device when viewed in a direction perpendicular to a main surface of the substrate,
wherein the insulating layer includes a first portion disposed over the first lower electrode, a second portion disposed between the first lower electrode and the second lower electrode, and a third portion disposed over the second lower electrode, when viewed in the plan view,
wherein the first portion includes a first inclined portion, the second portion includes a plurality of inclined portions including a second inclined portion, and the third portion includes a third inclined portion,
wherein the second inclined portion is closest to the second lower electrode among the plurality of inclined portions included in the second portion,
wherein the second inclined portion overlaps the overlapping region, when viewed in the plan view,
wherein the protective layer is continuously disposed over the first lower electrode and the second lower electrode,
wherein the protective layer includes a low-density region, and
wherein the low-density region overlaps said overlapping region when viewed in said plan view.

20. A light-emitting device comprising:
a substrate;
a plurality of lower electrodes disposed over the substrate:
a light-emitting layer disposed over at least of the plurality of lower electrodes;
an upper electrode disposed over the light-emitting layer;
a color filter layer disposed over the upper electrode;
an insulating layer disposed between the plurality of lower electrodes and the light-emitting layer so as to cover an end portion of each of the plurality of lower electrodes; and
a protective layer disposed between the upper electrode and the color filter layer,
wherein the plurality of lower electrodes includes a first lower electrode and a second lower electrode adjacent to each other,
wherein the color filter layer includes a first color filter disposed over the first lower electrode and a second color filter disposed over the second lower electrode, the first color filter and the second color filter being arranged so as to partially overlap each other, in an overlapping region, when viewed in a plan view of the light emitting device when viewed in a direction perpendicular to a main surface of the substrate,
wherein the insulating layer includes a first portion disposed over the first lower electrode, a second portion disposed between the first lower electrode and the second lower electrode, and a third portion disposed over the second lower electrode, when viewed in the plan view,
wherein the first portion includes a first inclined portion, the second portion includes a plurality of inclined portions including a second inclined portion, and the third portion includes a third inclined portion,
wherein the second inclined portion is closest to the second lower electrode among the plurality of inclined portions included in the second portion,
wherein the second inclined portion overlaps the overlapping region, when viewed in the plan view,
wherein the protective layer is continuously disposed over the first lower electrode and the second lower electrode,
wherein the protective layer includes a cavity, and
wherein the cavity overlaps said overlapping region when viewed in said plan view.

* * * * *